(12) United States Patent
Webber

(10) Patent No.: US 9,810,750 B2
(45) Date of Patent: Nov. 7, 2017

(54) NUCLEAR MAGNETIC RESONANCE PROBES

(71) Applicant: John Beausire Wyatt Webber, Ramsgate (GB)

(72) Inventor: John Beausire Wyatt Webber, Ramsgate (GB)

(*) Notice: Subject to any disclaimer, the term of this patent is extended or adjusted under 35 U.S.C. 154(b) by 548 days.

(21) Appl. No.: 14/316,409

(22) Filed: Jun. 26, 2014

(65) Prior Publication Data

US 2015/0002155 A1    Jan. 1, 2015

(30) Foreign Application Priority Data

Jun. 26, 2013  (GB) .................................. 1311351.9

(51) Int. Cl.
*G01V 3/00* (2006.01)
*G01R 33/31* (2006.01)
*G01R 33/34* (2006.01)

(52) U.S. Cl.
CPC ............ *G01R 33/31* (2013.01); *G01R 33/34* (2013.01)

(58) Field of Classification Search
CPC ...................................................... G01R 33/31
USPC ......................................... 324/315, 321, 318
See application file for complete search history.

(56) References Cited

U.S. PATENT DOCUMENTS

| 3,525,928 | A | * | 8/1970 | Nagao | .................... | G01R 33/30 |
| | | | | | | 165/109.1 |
| 5,192,910 | A | * | 3/1993 | Hepp | ........................ | B01L 7/00 |
| | | | | | | 324/315 |
| 5,530,353 | A | | 6/1996 | Blanz | | |
| 6,812,705 | B1 | | 11/2004 | Sellers | | |
| 7,015,692 | B2 | | 3/2006 | Clarke et al. | | |
| 7,049,817 | B2 | * | 5/2006 | Fleury | .................... | G01R 33/31 |
| | | | | | | 324/307 |
| 7,378,847 | B2 | | 5/2008 | Barbara et al. | | |
| 2014/0084928 | A1 | * | 3/2014 | Gisler | .................... | G01R 33/31 |
| | | | | | | 324/321 |
| 2015/0300968 | A1 | * | 10/2015 | Bae | ...................... | G01N 24/088 |
| | | | | | | 506/6 |

FOREIGN PATENT DOCUMENTS

GB          2361554          6/2004

* cited by examiner

*Primary Examiner* — Louis Arana
(74) *Attorney, Agent, or Firm* — Haugen Law Firm PLLP

(57) ABSTRACT

An NMR probe including an RF coil, a sample region defined within the coil, and a thermal control apparatus comprising a thermal control fluid circuit having a thermal control fluid inlet and a thermal control fluid outlet to control the temperature of the sample region.

14 Claims, 2 Drawing Sheets

NUCLEAR MAGNETIC RESONANCE PROBES

The present invention relates to probes for use in nuclear magnetic resonance (NMR) spectrometers which have improved performance.

Conventional NMR probes are intended to operate at room temperature and with relatively narrow sample tubes. However, certain NMR techniques, such as cryoporometry (see, for example "Nuclear Magnetic Resonance Cryoporometry", *Phys. Rep.* 461: 1-36) require the sample to be maintained at a stable and uniform temperature below room temperature. In addition, it may be required or desired to maintain the sample at a stable, uniform and fixed temperature above room temperature Furthermore, the RF field lines generated by conventional RF coils of NMR probes are not always co-linear and uniform throughout the sample. The efficiency of an NMR spectrometer may be increased if the RF field lines could be aligned such that they are uniform throughout the sample.

The present invention seeks to address or ameliorate one or more the problems that exist with conventional NMR probes.

According to a first aspect of the invention, there is provided an NMR probe including an RF coil, a sample region defined within the coil, and a thermal control apparatus comprising a thermal control fluid circuit having a thermal control fluid inlet and a thermal control fluid outlet to control the temperature of the sample region. Such an arrangement allows the temperature of the sample region to be controlled and maintained at a desired temperature. The temperature of the sample region can be controlled by controlling the temperature of the thermal control fluid.

Suitably, the temperature of the sample region is lowered. Thus, the thermal control apparatus may be a cooling apparatus comprising a cooling fluid circuit having a cooling fluid inlet and a cooling fluid outlet. However, it will be appreciated that the temperature of the sample region could instead be raised, in which case, the thermal control apparatus would be a heating apparatus comprising a heating fluid circuit having a heating fluid inlet and a heating fluid outlet.

In an embodiment of the invention, the thermal control apparatus is a cooling apparatus which further includes a thermoelectric cooling (Peltier) element. A thermoelectric or Peltier cooling element uses electrical energy to drive heat transfer from one side of the element to the other. Thus, a thermoelectric or Peltier cooling element can be thought of as a solid state active heat pump having a relatively hot side and a relatively cool side. The temperature at the relatively cool side of the element can be controlled by controlling the electrical energy applied to the element Examples of Peltier cooling elements and how they work will be well known to those skilled in the art and will not be discussed in more detail herein. It will also be appreciated that the Peltier element could be used in a heating circuit to drive heat energy from the heating fluid to the sample region.

In a further embodiment of the invention of the invention as defined anywhere herein, the probe further includes a body formed from a heat conductive material which defines an open channel, the channel being configured to receive therein an NMR sample tube. The body is suitably tubular, to define a cylindrical channel, and is open at both ends. The body may have a circular cross section or it may have an alternative cross sectional shape.

The body is suitably located within the RF coil.

The channel-defining body is suitably thermally coupled to the cooling apparatus. Thus, the cooling apparatus may be directly thermally coupled to the body or the two components may be thermally coupled via an intermediate thermally conductive member.

The body may include one or more thermally conductive tabs projecting therefrom. The body may be thermally coupled to the cooling apparatus via the, one of the, or each tab.

In this embodiment, a sample within an NMR sample tube located within the channel defined by the body is maintained in a cooled isothermal environment. It will be appreciated that maintaining the sample in an isothermal environment improves the performance of the NMR spectrometer.

In an embodiment of the invention, the cooling apparatus includes a thermoelectric cooling (Peltier) element thermally coupled to a heat transfer element; the body is thermally coupled directly or indirectly to the thermoelectric cooling element; and the heat transfer element defines therein the cooling fluid circuit and includes a cooling fluid inlet and a cooling fluid outlet, such that heat energy is transferred from the body to the heat transfer element via the thermoelectric cooling element.

In this arrangement, the thermoelectric cooling element drives the heat transfer from the body to the cooling fluid and is able to maintain the body (and therefore a sample located within the channel defined by the body) at a desired temperature which is below room temperature. The heat transfer element removes heat energy from the relatively hot side of the Peltier element and the relatively cool side of the Peltier element maintains the body at the desired temperature, thus providing an isothermal environment.

The heat transfer element is suitably formed from a metal, such as copper or aluminium.

The cooling apparatus may include more than one thermoelectric cooling elements and/or more than one heat transfer elements. For example, it may comprise two or more thermoelectric cooling elements where each cooling element has an associated heat transfer element or it may comprise two or more thermoelectric cooling elements thermally coupled to a common heat transfer element. Furthermore, the thermoelectric cooling elements may be connected in series such that the relatively hot side of one element is coupled to the relatively cool side of a neighbouring element. In this arrangement, the free relatively cool side of the series of elements is thermally coupled to the body and the free relatively hot side of the series of elements is thermally coupled to a heat transfer element.

In order to monitor the temperature of the body, and thus the temperature of a sample within a sample tube located within the channel defined by the body, the body may be thermally coupled to a temperature sensor. The temperature sensor may record and/or display the temperature of the body in use.

According to a second aspect of the invention, there is provided an NMR probe including an RF coil, a sample region and an RF flux line conditioner comprising a body which is formed from an electrically conductive material, the body defining a non-conductive axial region along the entire length of the body in the form of an axial gap in the body; wherein the RF flux line conditioner is located within the RF coil and the body of RF flux line conditioner defines therein the sample region. Thus the body is in the form of a discontinuous tube and includes an axial gap. The axial gap may be left open (i.e. an air gap) or it may be filled with a non-conductive material.

The RF flux line conditioner forces the lines of RF flux generated by the RF coil to align substantially parallel to the longitudinal axis of the body, wherein the aligned RF flux lines pass through the sample region. As the sample is typically located within the sample region, it is subjected to a more uniform RF magnetic field.

In addition, by conditioning the RF magnetic field in this way, it is possible to use a larger NMR coil. Conventionally, the RF coil is configured to be located closely around the sample tube in use, so that the RF coil defines the sample region and the RF field lines pass through the sample. However, by conditioning the RF flux lines with the conditioner body, it is possible to use a relatively larger coil, as the conditioner body located within the coil guides the RF flux lines uniformly through the sample region. The use of a larger RF coil may improve performance of the spectrometer and may make the design and construction of the probe easier.

The body of the RF conditioner suitably has a substantially circular cross section. However, alternative cross sectional shapes are within the scope of the invention, for example, the RF conditioner may have a cross sectional shape that is substantially triangular, rectangular, pentagonal, hexagonal, heptagonal, octagonal, etc.

The discontinuous nature of the RF conditioner body prevents the RF field shorting through the body.

The probe according to the second aspect of the invention may contain a thermal control apparatus as described and defined anywhere herein.

In embodiments of the invention which include both an RF conditioner body and a thermal control apparatus including a heat conductive body, it will be appreciated that the heat conductive body and the RF conditioner may be formed as a single element where the material of the body is both heat conductive and electrically conductive, such as a metal for example.

Suitable metals include copper and aluminium. Alternatively, both components may be present as separate components.

The skilled person will appreciate that the features described and defined in connection with the aspect of the invention and the embodiments thereof may be combined in any combination, regardless of whether the specific combination is expressly mentioned herein. Thus, all such combinations are considered to be made available to the skilled person.

An embodiment of the invention will now be described, by way of example only, with reference to the accompanying drawings in which.

For the avoidance of doubt, the skilled person will appreciate that in this specification, the terms "up", "down", "front", "rear", "upper", "lower", "width", etc. refer to the orientation of the components as found in the example when installed for normal use as shown in the Figures.

Figure 1:
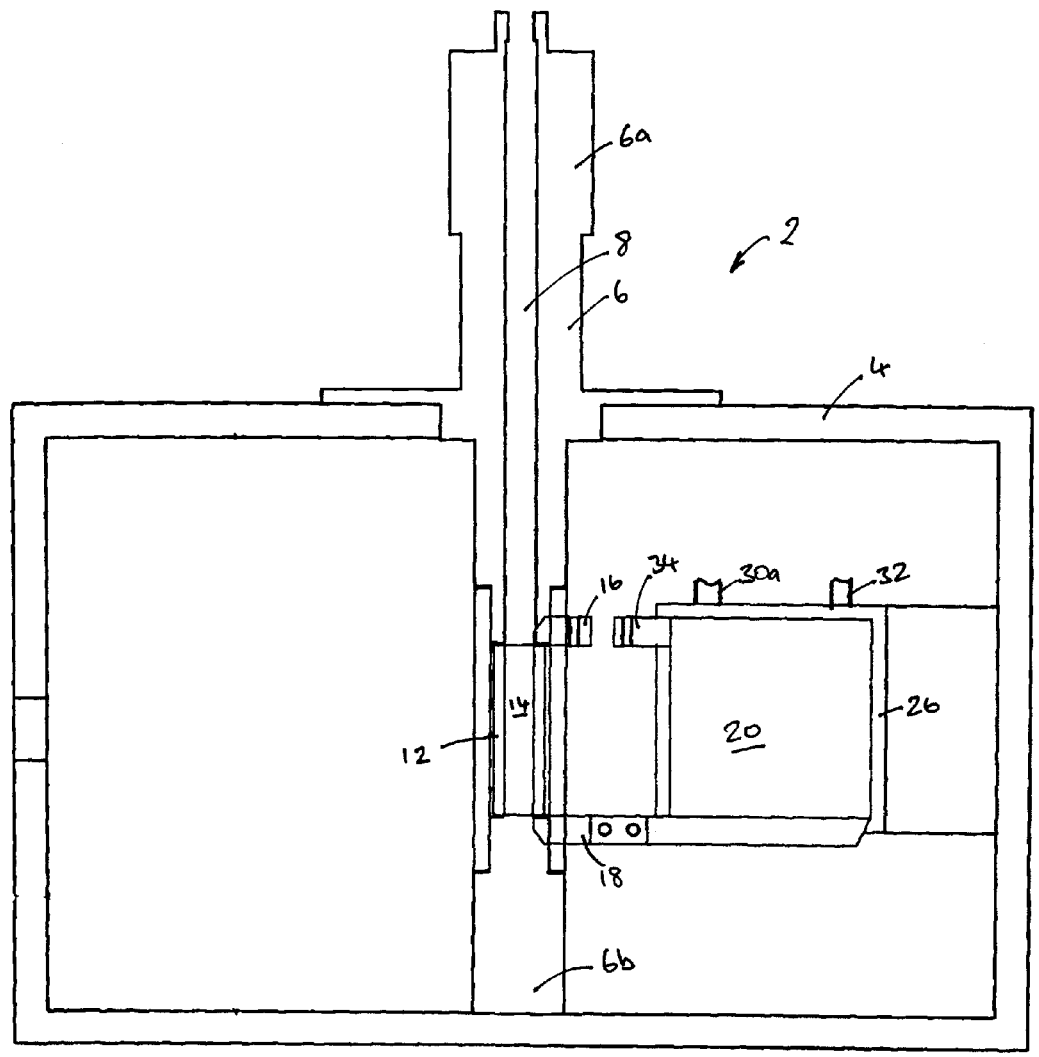
FIG. 1 is a vertical sectional view through an NMR probe according to the invention.

FIG. 1 shows an NMR probe 2 comprising a conventional aluminium frame 4 and a central PTFE core 6. The PTFE core 6 defines a central cavity 8 within which a sample tube (not shown) is located in use, and comprises an upper part 6a and a lower part 6b.

Figure 2:
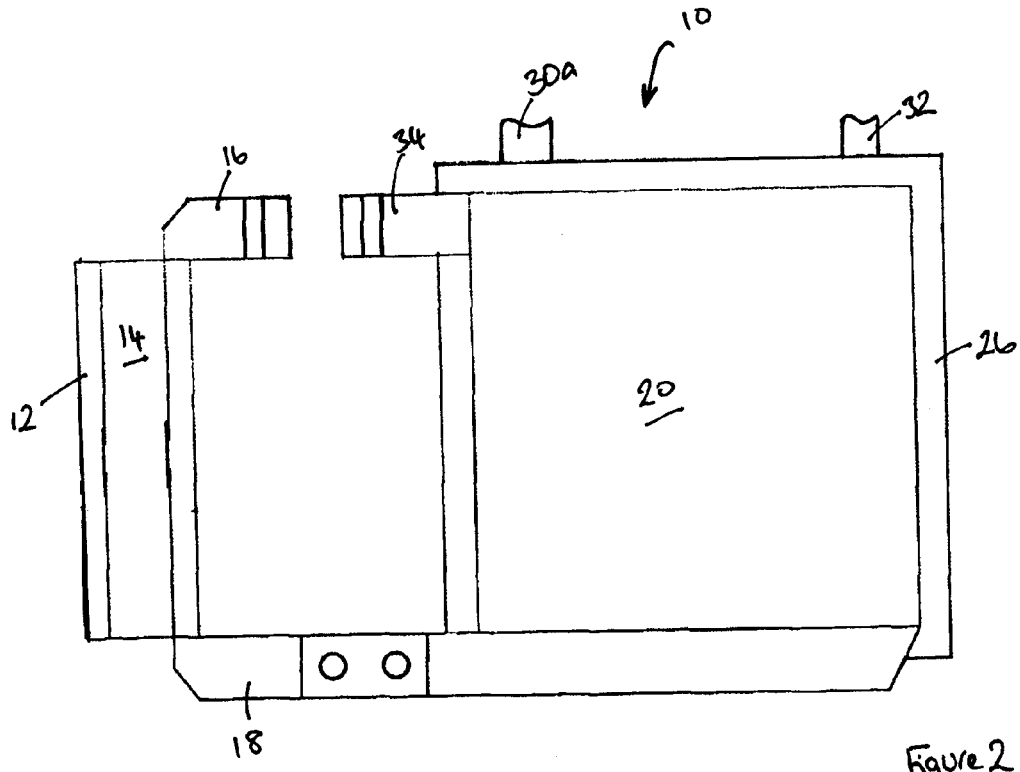
FIG. 2 is a vertical sectional view through a portion of the probe shown in FIG. 1.

Located between the upper part 6a of the PTFE core and the lower part 6b of the PTFE core is a combined cooling apparatus and flux line conditioner 10 which is shown in more detail in FIG. 2.

The combined cooling apparatus and flux line conditioner 10 includes a cylinder 12 formed from copper. The copper cylinder 12 defines a central cavity 14 which is arranged such that the central cavity 14 of the copper cylinder 12 aligns with the central cavity 8 of the PTFE core.

The copper cylinder 12 further includes an axial opening (not shown in FIG. 2) which extends through the wall of the cylinder and along its entire length.

Extending radially outwards from each end portion of the cylinder 12 are tabs 16, 18. The bottom tab 18 connects the cylinder 12 to a central heat sink element 20, which is shown in more detail in FIG. 3. The top tab 16 provides a mounting point for a temperature sensor (not shown) such that the temperature of the cylinder 12 can be monitored, which in turn indicates a temperature of a sample located within the cylinder 12.

An RF coil (not shown) is wound around the outside of the copper cylinder 12. It will be appreciated that the RF coil is connected to a conventional controller in order to generate an RF field within which a sample is located in use. It will also be appreciated that the RF coil may be wound around the outside of the copper cylinder 12 or a thin layer of insulating material may be located between the RF coil and the copper cylinder 12. The arrangement and operation of the RF coil is well known to those skilled in the art of NMR probes and as such, this arrangement will not be discussed in detail herein.

Figure 3:
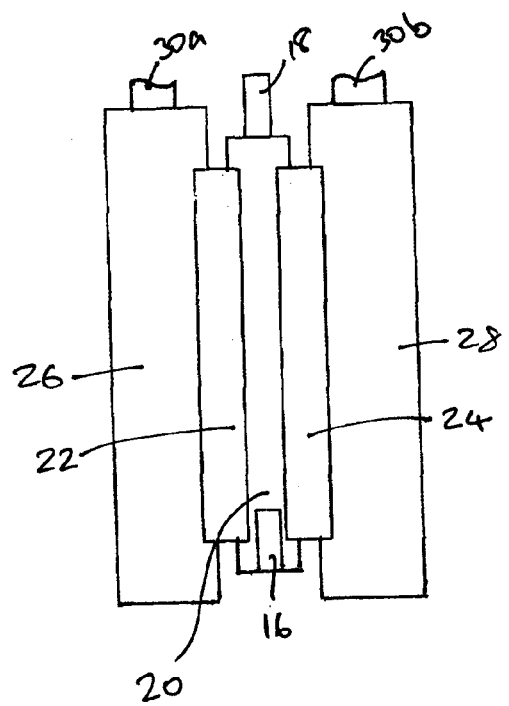
FIG. 3 is a vertical sectional view through the cooling apparatus of the probe shown in FIGS. 1 and 2.

Turning to FIG. 3, this figure shows a cooling apparatus including the central heat sink element 20. Located on each side of the central heat sink element 20 is a respective Peltier (thermoelectric cooling) element 22, 24. For each of the Peltier elements 22, 24, the hot side of the element contacts the central heat sink element 20 and the cool side of the element faces outwards, where it is in contact with a respective outer heat sink element 26, 28. The two Peltier elements 22, 24 are electrically connected to a controller (not shown), which controls the electrical energy supplied to the elements to drive the heat transfer from the hot side of each element (thermally coupled to the central heat sink element 20) to the cool side of each element (thermally coupled to the respective outer heat sink element 26, 28).

The central heat sink element 20 and the two outer heat sink elements 26, 28 are formed from copper. In addition, the two outer heat sink elements 26, 28 each define an internal fluid conduit (not shown). The internal fluid conduits terminate at one end in a fluid inlet port 30a, 30b and at the other end in a fluid outlet port 32 (only one fluid outlet is shown in FIG. 2).

Projecting from the top of the central heat sink element 20, towards the upper tab 16 is a second tab 34. The two tabs 16, 34 are spaced apart and, like the upper tab 16, the second tab 34 is also connected to a temperature sensor (not shown) such that any temperature variation between the central heat sink element 20 and the copper cylinder 12 can be monitored.

In use, a sample tube (not shown) is located within the cavity 8 defined by the PTFE core 6 such that the sample tube also sits within the copper cylinder 12. The copper cylinder 12 provides the sample within the sample tube with a controlled isothermal environment and also conditions the RF flux lines such that they align with the longitudinal axis of the copper cylinder 12 and pass uniformly through the sample located within the sample tube. The axial opening or slot in the body of the cylinder 12 prevents the RF flux lines from shorting.

The temperature of the copper cylinder is lowered to the desired temperature by the cooling apparatus. Heat is drawn from the cylinder 12 by the central heat sink element 20 via the lower tab 18. The two Peltier elements 22, 24 are electrically energised and heat energy is "pumped" by them from the central heat sink element 20 to the two outer heat sink elements 26, 28. The heat energy transferred to the two outer heat sink elements 26, 28 is then transferred to an external cooler (not shown) by the cooling fluid flowing within the cooling fluid conduit defined within each of the two outer heat sink elements 26, 28. Thus, the cooling fluid circulates around a fluid cooling circuit comprising the cooler, the fluid inlet port 30*a*, 30*b*, the internal fluid conduit, and the fluid outlet port. The skilled person will appreciate that there may be two separate cooling circuits, one for each of the two outer heat sink elements 26, 28 or the cooling apparatus 10 may include a single cooling circuit which includes both of the outer heat sink elements 26, 28, for example, the cooling fluid exiting the fluid outlet port of one of the outer heat sink elements may then enter the fluid inlet port of the other of the outer heat sink elements.

The temperature of the cylinder 12 can be controlled by the power supplied to the Peltier elements 22, 24, or by the temperature of the cooling fluid entering the outer heat sink elements 26, 28, or by a combination of both of these.

The invention claimed is:

1. An NMR probe including an RF coil which defines therein a sample region; a body formed from a heat conductive and electrically conductive material which defines an open cylindrical channel, the body being located within the RF coil and the channel being configured to receive therein an NMR sample tube; and a thermal control apparatus comprising a thermal control fluid circuit having a thermal control fluid inlet and a thermal control fluid outlet to control the temperature of the sample region, wherein the body defines a non-conductive axial region along an entire length of the body formed by an axial gap through a wall of the body.

2. An NMR probe according to claim 1, wherein the thermal control apparatus further includes a thermoelectric cooling (Peltier) element.

3. An NMR probe according to claim 1, wherein the body is thermally coupled to the thermal control apparatus.

4. An NMR probe according to claim 3, wherein the thermal control apparatus is a cooling apparatus which includes a thermoelectric cooling element thermally coupled to a heat transfer element; the body is thermally coupled to the thermoelectric cooling element; and the heat transfer element defines therein a cooling fluid circuit and includes a cooling fluid inlet and a cooling fluid outlet, such that the body is cooled by the transfer of heat energy from the body to the heat transfer element via the thermoelectric cooling element.

5. An NMR probe according to claim 4, wherein the body is thermally coupled to a temperature sensor.

6. An NMR probe according to claim 3, wherein the body is thermally coupled to a temperature sensor.

7. An NMR probe according to claim 1, wherein the body is formed from a metal.

8. An NMR probe according to claim 7, wherein the metal is copper.

9. An NMR probe including an RF coil and a thermally and electrically conductive body disposed in a first region defined within the RF coil, wherein the body defines a sample cavity configured to receive NMR sample therein, the NMR probe further including a thermal control apparatus for controlling temperature of the NMR sample, the thermal control apparatus having a thermal control fluid circuit with a thermal control fluid inlet and a thermal control fluid outlet, the thermal control fluid circuit being thermally coupled to the body, wherein the body conductively regulates temperature of the NMR sample.

10. An NMR probe according to claim 9, wherein the thermal control apparatus further includes a thermoelectric cooling element.

11. An NMR probe according to claim 9, wherein the thermal control apparatus is a cooling apparatus which includes a thermoelectric cooling element thermally coupled to a heat transfer element; the body is thermally coupled to the thermoelectric cooling element; and the heat transfer element defines therein a cooling fluid circuit and includes a cooling fluid inlet and a cooling fluid outlet, such that the body is cooled by the transfer of heat energy from the body to the heat transfer element via the thermoelectric cooling element.

12. An NMR probe according to claim 11, wherein the body is thermally coupled to a temperature sensor.

13. An MNR probe according to claim 9, wherein the body is formed from a metal.

14. An NMR probe according to claim 13, wherein the metal is copper.

* * * * *